(12) United States Patent
Titus (10) Patent No.: US 7,684,213 B2
(45) Date of Patent: Mar. 23, 2010

(54) CRU INTERLOCKING EMI SHIELD

(75) Inventor: Gregory C. Titus, Wichita, KS (US)

(73) Assignee: LSI Corporation, Milpitas, CA (US)

( * ) Notice: Subject to any disclaimer, the term of this patent is extended or adjusted under 35 U.S.C. 154(b) by 265 days.

(21) Appl. No.: 11/821,617

(22) Filed: Jun. 25, 2007

(65) Prior Publication Data

US 2008/0043454 A1 Feb. 21, 2008

Related U.S. Application Data

(60) Provisional application No. 60/806,652, filed on Jul. 6, 2006.

(51) Int. Cl.
*H05K 9/00* (2006.01)
(52) U.S. Cl. .................. 361/818; 361/816; 361/800
(58) Field of Classification Search .......... 361/600, 361/679, 728, 730, 748, 752, 760, 790, 797, 361/800, 816, 818; 174/35 R, 51
See application file for complete search history.

(56) References Cited

U.S. PATENT DOCUMENTS

| | | | | |
|---|---|---|---|---|
| 6,359,768 B1 * | 3/2002 | Eversley et al. | ............. | 361/212 |
| 6,661,651 B1 * | 12/2003 | Tanzer et al. | ........... | 361/679.33 |
| 6,673,998 B1 * | 1/2004 | Wu | ........................... | 174/383 |
| 6,816,982 B2 * | 11/2004 | Ravid | .......................... | 714/20 |
| 6,954,357 B2 * | 10/2005 | Tseng et al. | ........... | 361/679.55 |
| 7,129,422 B2 * | 10/2006 | Arnold | ........................ | 174/377 |
| 7,442,881 B1 * | 10/2008 | Chien | .......................... | 174/382 |
| 7,447,011 B2 * | 11/2008 | Wade et al. | ............ | 361/679.33 |
| 7,488,902 B2 * | 2/2009 | English et al. | .............. | 174/382 |
| 7,491,900 B1 * | 2/2009 | Peets et al. | .................. | 174/383 |

* cited by examiner

*Primary Examiner*—Hung S Bui
(74) *Attorney, Agent, or Firm*—Suiter Swantz pc llo (57) ABSTRACT

An EMI shield apparatus for connecting to a CRU frame, a memory unit emitting EMI through a periphery of the CRU frame, the EMI shield apparatus comprising a shield base, a plurality of sides bordering the shield base for blocking EMI emitted from a portion of the periphery of the CRU frame, and a plurality of tabs connected to at least one of the plurality of sides for blocking EMI emitted from the corners of the periphery of the CRU frame when the plurality of sides are in a compressed condition.

6 Claims, 8 Drawing Sheets

CRU INTERLOCKING EMI SHIELD

CROSS-REFERENCE TO RELATED APPLICATIONS

The present application claims the benefit under 35 U.S.C. § 119(e) of U.S. Provisional Application Ser. No. 60/806,652, filed Jul. 6, 2006. Said U.S. Provisional Application Ser. No. 60/806,652 is herein incorporated by reference in its entirety.

FIELD OF THE INVENTION

The present invention generally relates to the field of computer systems and configurations and more particularly to an electromagnetic interference (EMI) shield for a customer replaceable unit (CRU) within a computer or server housing.

BACKGROUND OF THE INVENTION

Electronic equipment, such as a computing system, frequently emits undesirable electronic magnetic radiation, commonly referred to as electromagnetic interference (EMI). The ever increasing complexity of modern computer systems and information networks has made the ability to comply with EMI emission requirements more difficult. For example, increased higher operating frequencies have resulted in increased EMI emissions from computer systems. Additionally, higher frequency chips emit EMI at higher frequencies. The higher frequency EMI may emanate from an enclosure through smaller openings when compared to lower frequency EMI which was present in earlier computer systems. As a result, the emission of EMI through slots, apertures, and seams present in conventional EMI shielding is becoming increasingly problematic.

Regulations set forth by the Federal Communications Commission (FCC) do not permit products to emit EMI above pre-defined thresholds. Thus, containment of EMI is required for a variety of computer components including data storage systems in order for such systems to be certified by the FCC. Typically, data storage enclosures have joints or seams where two or more parts are joined together. These joints are a major source of EMI emission for the data storage system, particularly in and around component corners, such as drive bay corners of hard disk drives (HDDs) and other memory units.

Several methods currently exist for EMI containment in data storage systems. One conventionally utilized method for EMI containment is the use of "spring" type clips made of beryllium copper or stainless steel affixed to the periphery of the CRU. An additional method is the use of metallic tape affixed to the seam or joint area. Moreover, metallic foam shield material has been installed in and along seams and joints in a "single strip" orientation to shield EMI.

Common disadvantages associated with the currently available methods for EMI containment entail increased part counts, increased costs, increased assembly labor rates, and increased quality concerns. In addition, many current EMI shielding designs are inferior for they utilize the drive bays in which data storage systems, such as HDDs reside, thereby complicating the drive bay geometry. Further, EMI shielding on the data storage systems still do not fully cover the system from EMI emissions, particularly in and around corners. Still further, secure installation of EMI shielding generally requires additional fasteners or adhesives to be applied, which makes reuse of the shielding difficult and/or time consuming.

Therefore, it would be desirable to provide an EMI shield that provides continuous EMI shielding (including in and around data storage system corners), utilizes few parts, installs independent of a drive bay, and is easily reusable, while allowing for EMI shielding in accordance with desired standards.

SUMMARY OF THE INVENTION

Accordingly, the various embodiments of the present invention are directed to an EMI shield apparatus as well as a method and system for providing and implementing the same. In a first aspect of the present invention, an EMI shield apparatus comprises a shield base. Apparatus also comprises a plurality of sides bordering the shield base for blocking EMI emitted from a portion of the periphery of the CRU frame. Apparatus further comprises a plurality of tabs connected to at least one of the plurality of sides for blocking EMI emitted from the corners of the periphery of the CRU frame. Apparatus is suitable for providing continuous EMI shielding (including in and around data storage system corners), utilizes few parts, installs independent of a drive bay, and is easily reusable, while allowing for EMI shielding in accordance with desired standards.

In another aspect of the present invention, a method for providing an EMI shield apparatus comprises providing a shield base which is receivable by a CRU frame. Method also comprises providing a plurality of sides for blocking EMI emitted from a portion of a periphery of the CRU frame. Method further comprises providing a plurality of tabs connected to at least one of the plurality of sides for blocking EMI emitted from the corners of the periphery of the CRU frame. Method is suitable for providing an apparatus with continuous EMI shielding (including in and around data storage system corners), which utilizes few parts, installs independent of a drive bay, and is easily reusable, while allowing for EMI shielding in accordance with desired standards.

In yet another aspect of the present invention, an electronic device having a CRU frame with a periphery comprises a housing. Device also comprises a control unit within the housing for processing data and executing programs. Device further comprises a memory unit in the CRU frame for storing data to be processed and programs to be executed by the control unit. Device still further comprises an Input/Output system for inputting data to the memory unit and for outputting from the electronic device data processed by the control unit. Additionally, device comprises an EMI shield device for connecting to the CRU frame. The EMI shield device interlocks with the CRU frame and is configured to provide a continuous EMI shield around the periphery of the CRU frame. Device provides desirable EMI shielding without complicating drive bay geometry.

It is to be understood that both the foregoing general description and the following detailed description are exemplary and explanatory only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally to FIGS. 1-10, an electromagnetic interference (EMI) shield apparatus 100 is described in accordance with exemplary embodiments of the present invention. EMI shield apparatus 100 comprises a shield base 102, a first side 104, a second side 106 adjacent first side 104, a third side 108 adjacent second side 106 and opposite first side 104, and a fourth side 110 adjacent third side 108 and first side 104 and opposite second side 106. Shield base 102 is a substantially flat element with a first surface 112 and a second surface 114. Shield base 102 is bordered by first side 104, second side 106, third side 108, and fourth side 110 (collectively referred to as "sides 104-110"). Sides 104-110 each extend over a portion of first surface 112 and second surface 114 when sides 104-110 are in a non-compressed condition. EMI shield apparatus 100 is configured to provide a continuous EMI shield around the periphery of a consumer replaceable unit (hereinafter "CRU") assembly. A CRU assembly may be configured for coupling with a memory unit for storage of data, such as a hard disk drive, an optical disc drive, and the like. Once coupled with a memory unit, the CRU assembly may be inserted into a drive bay, such as in a computer or server housing, for operable coupling with the computer or server system.

EMI shield apparatus 100 may be composed of an EMI shielding material which may shield electromagnetic interference. Shielding material may be employed to contain EMI within a particular region or area. It is contemplated that EMI shielding material may be EMI absorbing material and/or EMI reflecting material. For example, EMI shield apparatus 100 is composed of stainless steel. Alternatively, EMI shield apparatus 100 may be composed of a silicon-based material (e.g., silicon elastomer), copper, brass, another metal or metal alloy, an organometallic material, and the like. The material composing EMI shield apparatus 100 may be a relatively hard, strong, and durable substance suitable for enabling reuse of EMI shield apparatus 100. Additionally, different gauges and thicknesses of materials may be utilized for containment and reduction of specific EMI frequencies. Therefore, EMI shield apparatus 100 may be comprised of particular materials, with different gauges and thicknesses, to shield EMI of particular frequencies to meet specific EMI requirements, such as FCC (Federal Communications Commission) regulations.

In a specific embodiment, EMI shield apparatus 100 is a single-piece design which may aid in ease of production, installation, and reuse. For example, EMI shield apparatus 100 may be produced from a single piece of material such that no assembly of pieces is required, such as being cut from a 0.005" stainless steel sheet and folded into the desired shape. In a present embodiment, sides 104-110 each extend from shield base 102 and each are folded to partially overlap a portion of the respective side of sides 104-110. Thus, the portion of the respective side of sides 104-110 extending beyond first surface 112 of shield base 102 may include more shielding material than the portion of the side extending beyond second surface 114 of shield base 102, as a result of the folding. For instance, first side 104 may extend from shield base 102 and may be folded three times: once at an angle to remove first side 104 from the plane of shield base 102 and to extend over a portion of first surface 112 of shield base 102 (e.g., greater than 90-degree angle counterclockwise from the horizontal); once to overlap the a portion of first side 104 and extend beyond first surface 112 (e.g., fold at an approximately 180-degree angle to make one portion approximately twice as thick, when compressed, as the original first side thickness); and once to fold the original first side thickness portion at an angle to extend over a portion of second surface 114 of shield base 102.

Alternatively, EMI shield apparatus 100 may be assembled from a plurality of pieces. The plurality of pieces may be securely fastened together such that EMI shield apparatus 100 obtains a desirably durable structure with structural properties similar to a single-piece design. For instance, the plurality of pieces may be joined via welding, adhering with an adhesive, fastening with a fastener, such as a mechanical or chemical fastener, etc.

EMI shield apparatus 100 is configured to operably engage a CRU frame 200 in order to shield EMI emissions produced by a memory unit housed in CRU frame 200. Particularly, EMI emissions remain shielded in and around corners, such as where the memory unit engages CRU frame 200 adjacent EMI shield apparatus 100. CRU frame 200 may be slidably and removably insertable into a drive bay, for example, in a computer cabinet, which may be a standard EIA (Electronic Industries Alliance) cabinet. Shield base 102 may be configured to correspond with size, shape, and component characteristics of standardized CRU frames to provide an effective and efficient base for EMI shield apparatus 100. For example, CRU frame 200 comprises substantial standardized features. Alternatively, shield base 102 may be configured to engage a custom (i.e., non-standardized) CRU frame.

Figure 7:
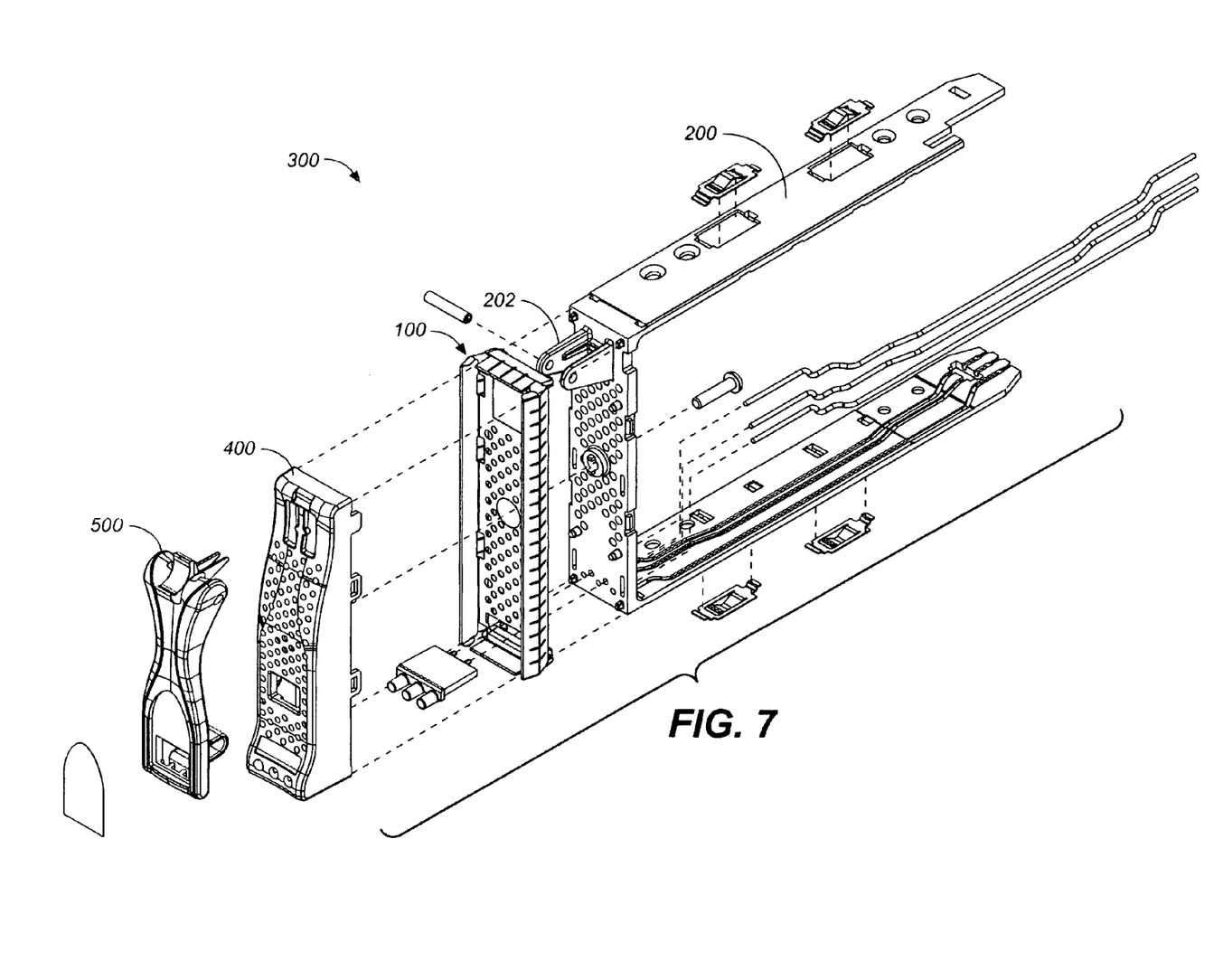
FIG. 7 is an exploded view illustrating a CRU assembly including the EMI shield apparatus of FIG. 1.
Figure 8:
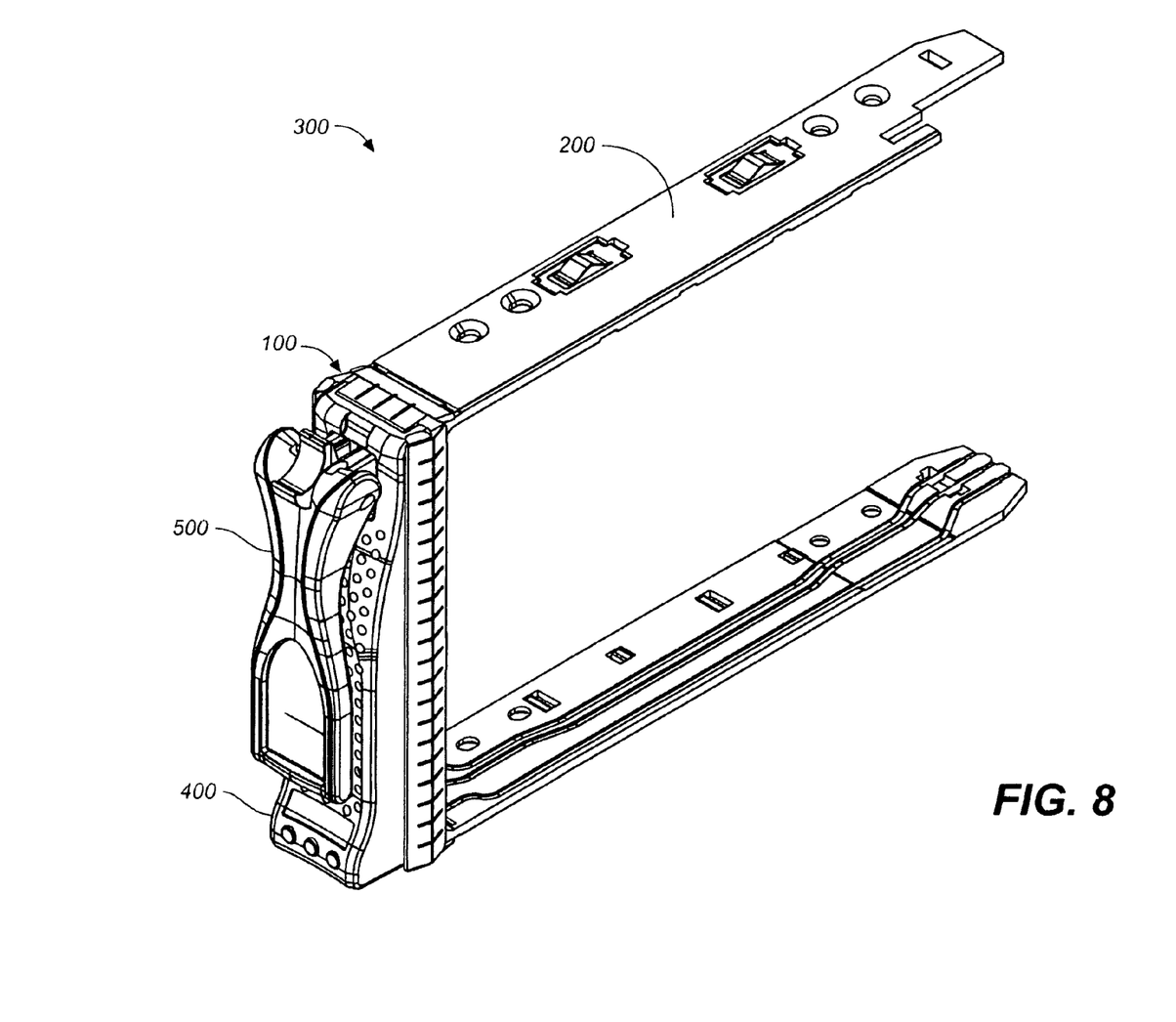
FIG. 8 is an isometric view of the CRU assembly of FIG. 7.
Figure 9:
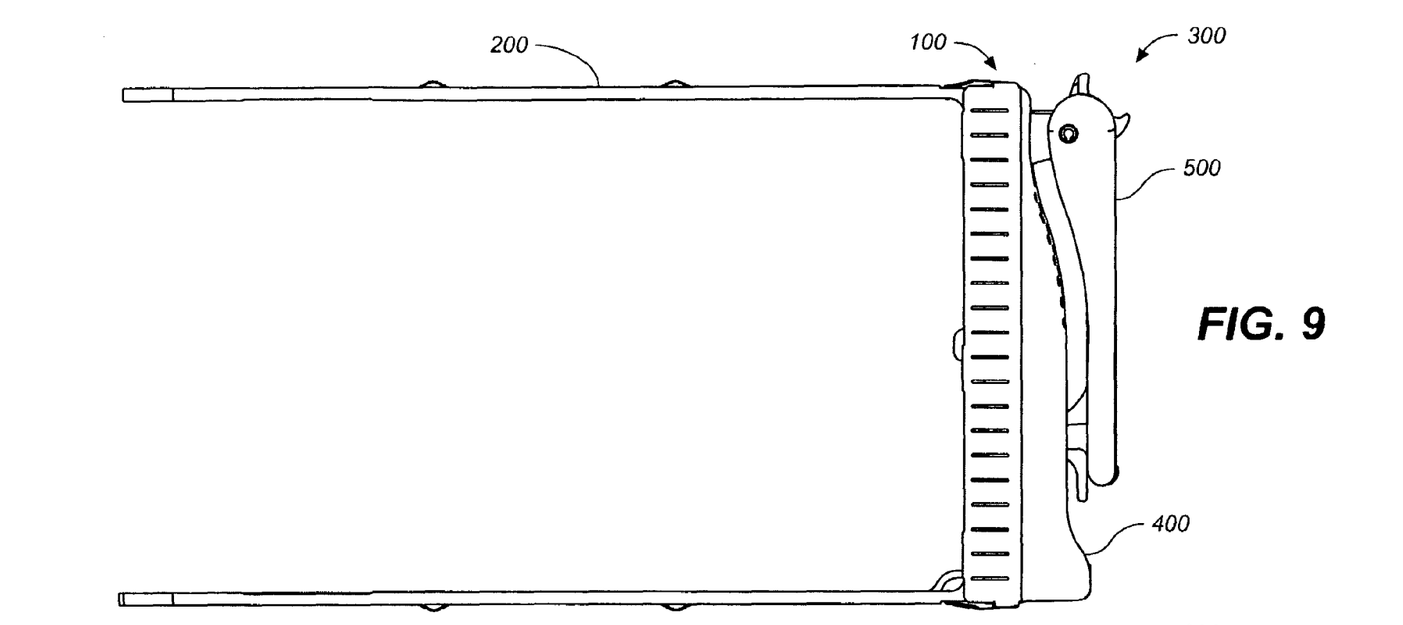
FIG. 9 is a top plan view of the CRU assembly of FIG. 7.
Figure 10:
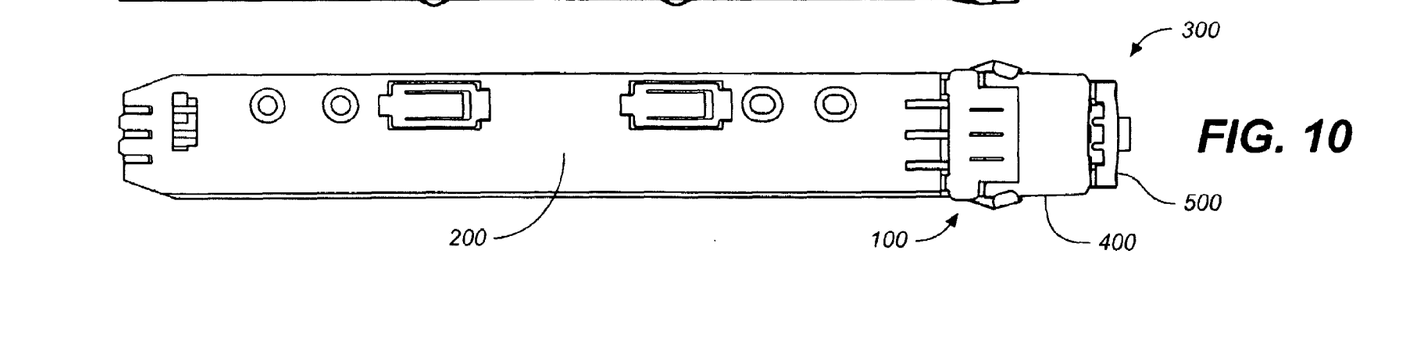
FIG. 10 is a side elevation view of the CRU assembly of FIG. 7.

A CRU assembly 300 comprises CRU frame 200, EMI shield apparatus 100, a bezel 400, and an ejector lever 500. CRU assembly 300 may be configured to operably couple with a memory unit, such as a hard disk drive, an optical disc drive, and the like, for entry into a drive bay. In a present embodiment, second side 106 and fourth side 110 each comprise locking clips 118 for locking EMI shield apparatus 100 to CRU frame 200. For instance, CRU frame 200 may comprise apertures into which locking clips 118 engage. To further interlock EMI shield apparatus 100 with CRU frame 200, first side 104 and third side 108 each comprise locking tabs 120. For example, locking tabs 120 may connect with portions of CRU frame 200 when EMI shield apparatus 100 is operably engaging CRU frame 200. Additionally, shield base 102 may comprise bezel apertures 122 configured to permit connectors from bezel 400 to connect to CRU frame 200 (as shown in FIG. 7) while EMI shield apparatus 100 is operably engaging CRU frame 200. Further, shield base 102 may comprise an ejector aperture 124 for enabling ejector axis prongs 202 of CRU frame 200 to pass through EMI shield apparatus 100. Ejector lever 500 may rotatably attach to ejector axis prongs 202 and is configured for providing a mechanical advantage to facilitate the insertion and removal of the CRU assembly 300. Advantageously, EMI shield apparatus may be insertable and removable to and from CRU frame 200 without the requirement of additional tools, accessories and the like.

Figure 5:
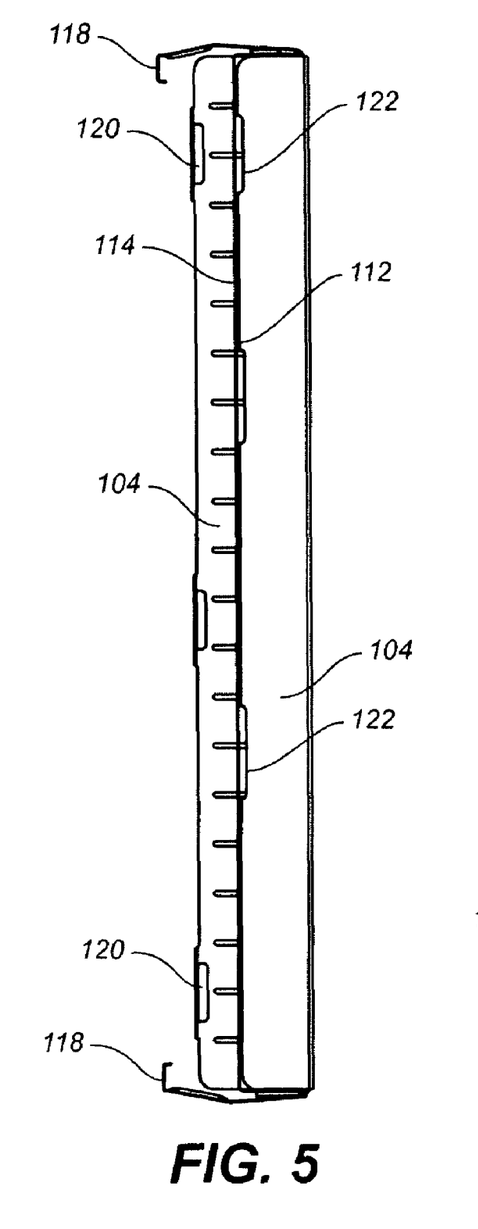
FIG. 5 is a cross-sectional bottom view of the EMI shield apparatus of FIG. 1 taken along line A-A of FIG. 2.
Figure 6:
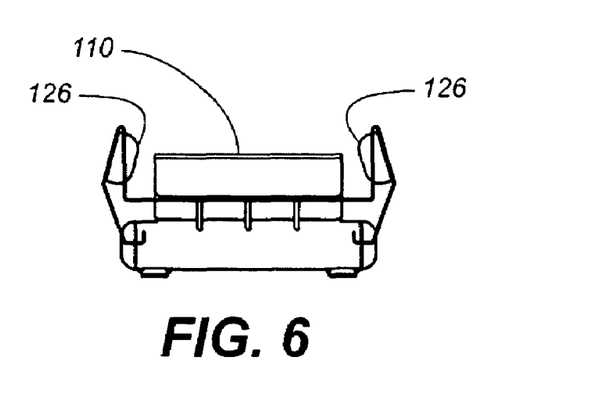
FIG. 6 is a cross-sectional side elevation view of the EMI shield apparatus of FIG. 1 taken along line B-B of FIG. 2.

Sides 104-110 each comprise slots 116 which may increase the flexibility of sides 104-110, easing insertion of CRU assembly 300 into a drive bay. For example, when EMI shield apparatus 100 is operably engaging CRU frame 200, CRU assembly 300 may more easily slide into the drive bay than if sides 104-110 of EMI shield apparatus 100 were more rigid. In a present embodiment, slots 116 do not extend the width of sides 104-110, in order to preserve a continuous portion of the material composing sides 104-110. Thus, when CRU assembly 300 is inserted into a drive bay with a memory unit, EMI shield apparatus 100 maintains a continuous piece of material on each of sides 104-110 for desirable EMI shielding. In one embodiment, slots 116 in first side 104 are configured such that slots 116 such that, when viewed along A-A (of FIG. 2), slots 116 are not visible along first surface 112, but remain visible along second surface 114 (as depicted in FIG. 5).

Figure 1:
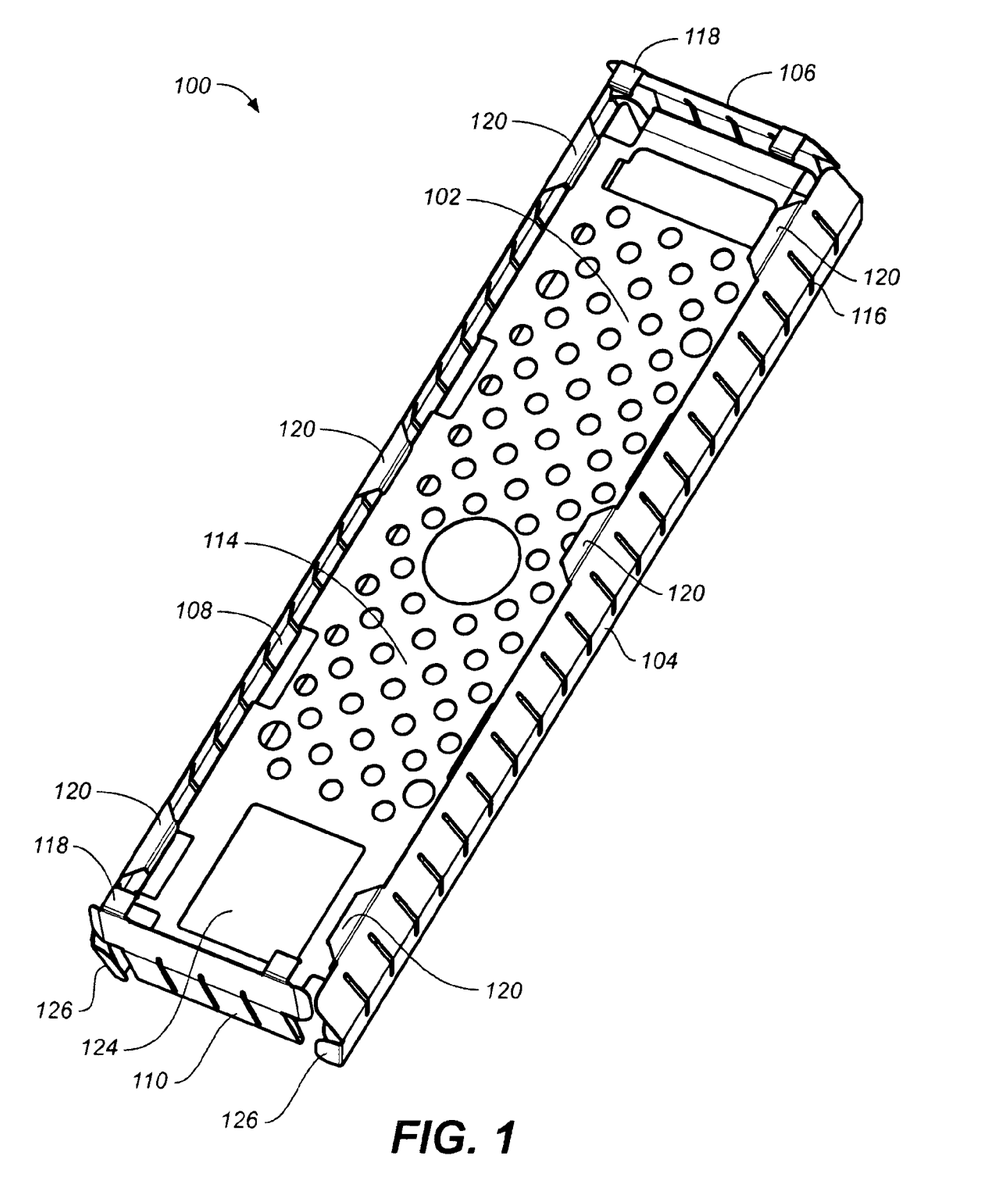
FIG. 1 is an isometric view illustrating an EMI shield apparatus in accordance with an exemplary embodiment of the present invention.
Figure 2:
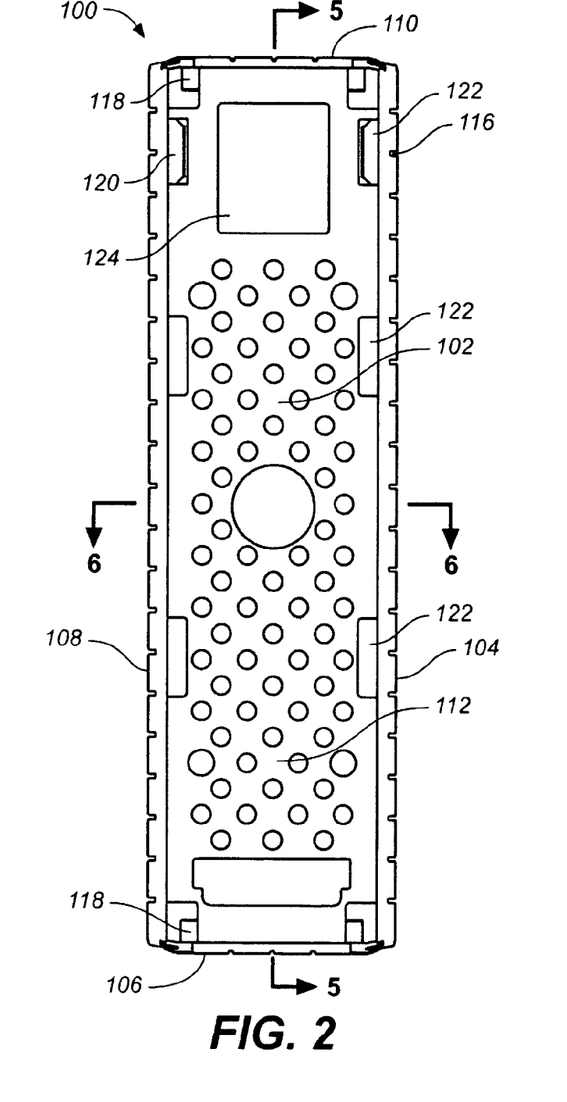
FIG. 2 is a front elevation view of the EMI shield apparatus of FIG. 1.
Figure 3:
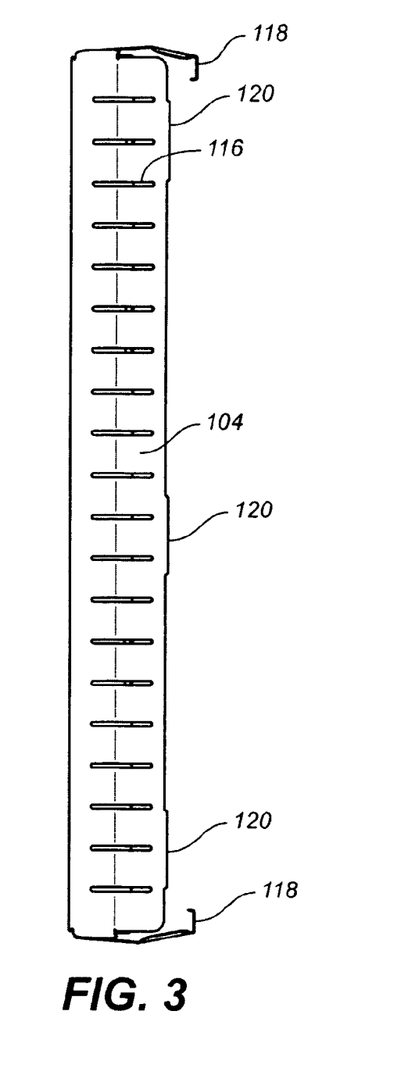
FIG. 3 is a top view of the EMI shield apparatus of FIG. 1.
Figure 4:
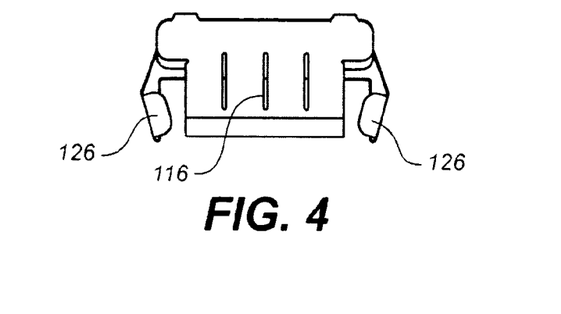
FIG. 4 is a side elevation view of the EMI shield apparatus of FIG. 1.

To seal off EMI emissions from corners, first side 104 and third side 108 comprise tabs 126 configured for overlapping corners of EMI shield apparatus 100 when CRU assembly 300 is inserted into a drive bay. For example, upon entry of CRU assembly 300 into a drive bay, the sides 104-110 become compressed, or become roughly perpendicular to shield base 102, wherein tabs 126 overlap or interlock with second side 106 and fourth side 110. Once sides 104-106 are compressed, tabs 106 of first side 104 and third side 108 may be approximately parallel to and partially overlap second side 106 and fourth side 110 in a manner such that EMI emissions are shielded from the corners. Thus tabs 126 and sides 104-110 provide a continuous EMI shield around the periphery of a CRU assembly such that no additional shielding may be necessary around a memory unit in a drive bay.

Figure 11:
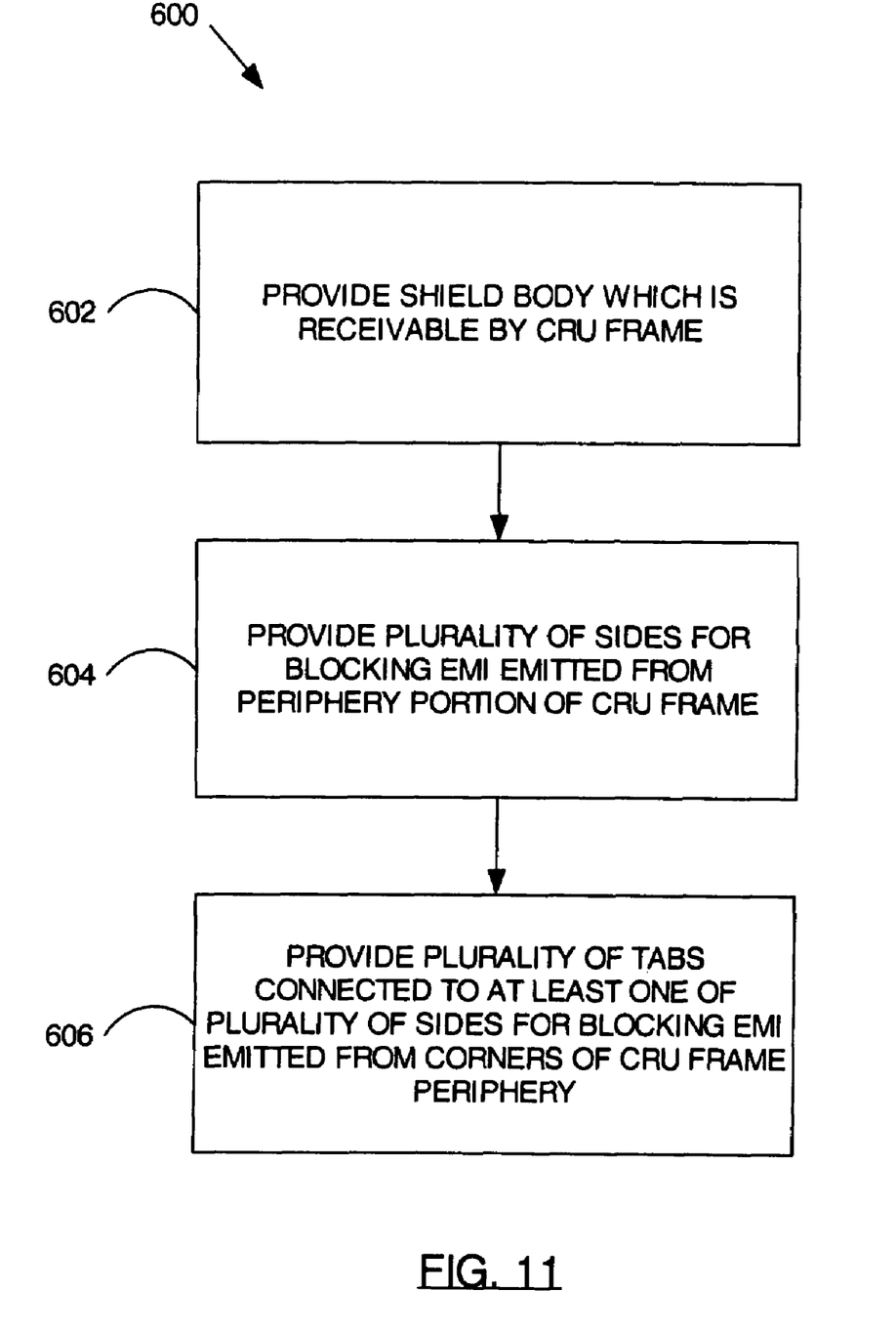
FIG. 11 depicts a flowchart of an exemplary EMI shield production method in accordance with an exemplary embodiment of the present invention.

Referring now to FIG. 11, a flowchart of an exemplary EMI shield production method 600 in accordance with an exemplary embodiment of the present invention is shown. EMI shield production method 600 provides a shield base which is receivable by a CRU frame 602. For example, the shield base may be shield base 102 and may include a plurality of apertures to interface with a standardized CRU frame. Additionally, EMI shield production method 600 provides a plurality of sides for blocking EMI emitted from a periphery portion of the CRU frame 604. For instance, the plurality of sides may be sides 104-110 and may include slots, such as slots 116, for increased flexibility to aid in compression upon entry into a drive bay. Further, EMI shield production method 600 provides a plurality of tabs connected to at least one of the plurality of sides for blocking EMI emitted from corners of the CRU frame periphery 606. For example the plurality of tabs may be tabs 126 to overlap or interconnect with a portion of the plurality of sides. The EMI shield produced by EMI shield production method 600 may provide a continuous EMI shield around the periphery of a CRU assembly such that no additional shielding may be necessary around a memory unit in a drive bay.

Figure 12:
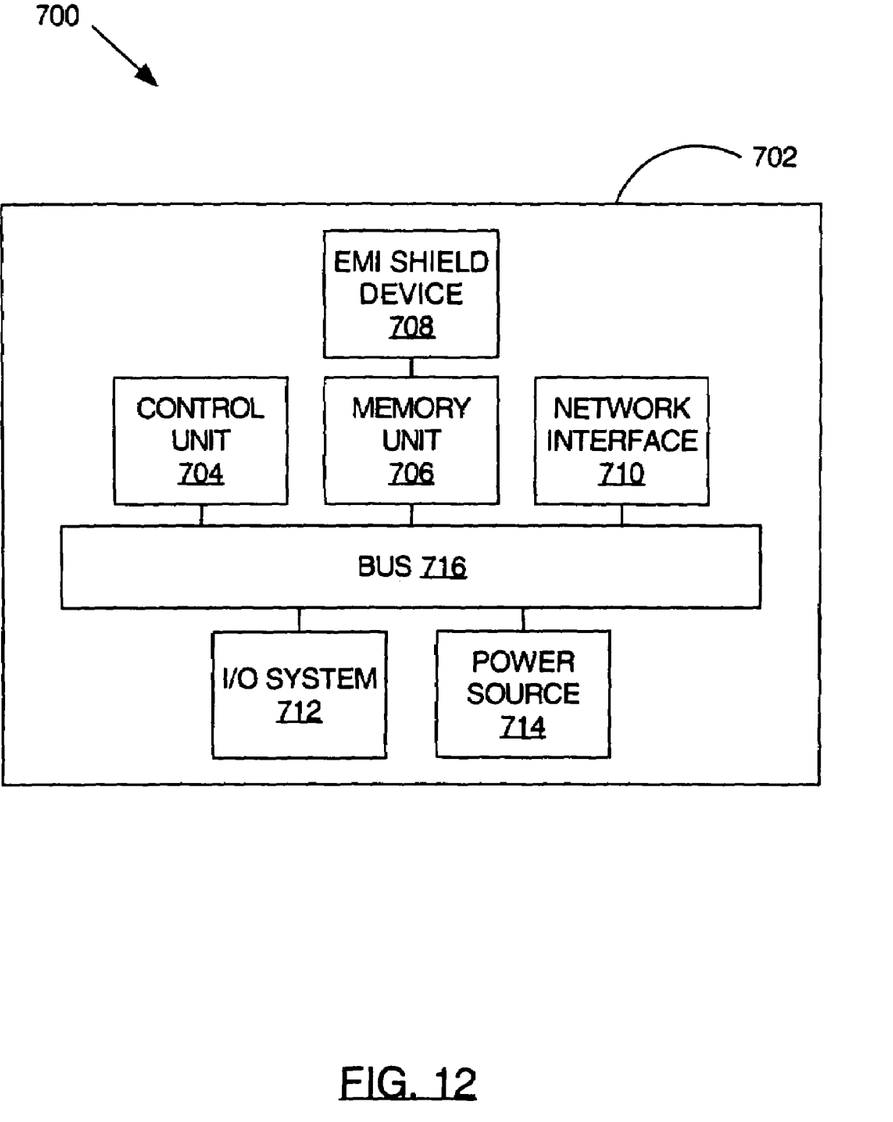
FIG. 12 depicts a block diagram of the architecture of an electronic device in accordance with an exemplary embodiment of the present invention.

Referring now to FIG. 12, a block diagram of the architecture of an electronic device 700 is shown in accordance with an exemplary embodiment of the present invention. Electronic device 700 comprises a housing 702, a control unit 704, a memory unit 706, an EMI shield device 708 coupled with the memory unit 706, a network interface 710, an input/output (I/O) system 712, a power source 714, and a bus 716. Control unit 704 is communicably coupled to bus 716 and performs data processing. Memory unit 706 is communicably coupled to bus 716 and stores data, such as program instructions, for manipulation by control unit 704. EMI shield device 708 is coupled with memory unit 706 to block EMI emitted from memory unit 706. In one specific embodiment, EMI shield device 708 is EMI shield apparatus 100, previously described with reference to FIGS. 1-10. Network interface 710 is communicably coupled to bus 716 enables electronic device 700 to communicate via public or private networks. I/O system 712 is communicably coupled to bus 716 and enables the input of data to and the output of data from electronic device 700. Power source 714 is coupled to bus 716 and supplies the power required for functioning of components within electronic device 700.

Without EMI shield device 708 in electronic device 700, the EMI emitted from memory unit 706 may disrupt the functioning of other electronic device components, such as control unit 704. For instance, without EMI shield device 708, the shielding within electronic device 700 would be insufficient to prevent radiation from ruining internal components, particularly as data transfer speeds increase. Thus, EMI shield device 708 enables electronic device 700 to function properly, without the internal components disabling each other.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An electronic device with a CRU frame having a periphery, the electronic device comprising:
   a housing;
   a control unit within the housing for processing data and executing programs;
   a memory unit in the CRU frame for storing data to be processed and programs to be executed by the control unit;
   an Input/Output system for inputting data to the memory unit and for outputting from the electronic device data processed by the control unit; and
   an EMI shield device for connecting to the CRU frame, the EMI shield including
      a shield base;
      a plurality of sides bordering the shield base for shielding EMI emitted from a portion of a periphery of the CRU frame; and
      a plurality of tabs, each tab of said plurality of tabs connected to a side of said plurality of sides for shielding EMI emitted from corners of a periphery of the CRU frame when the plurality of sides are in a compressed condition, wherein each tab coupled to said side of said plurality of sides is configured to partially overlap another side of said plurality of sides, wherein the EMI shield device interlocks with the CRU frame and is configured to provide a continuous EMI shield around the periphery of the CRU frame.

2. The electronic device of claim 1, wherein the EMI shield device comprises at least one of an EMI absorbing material and an EMI reflecting material.

3. The electronic device of claim 2, wherein the EMI shield device has been tuned to meet specific EMI requirements.

4. The electronic device of claim 1, wherein the EMI shield device is implemented with single-piece construction.

5. The electronic device of claim 1, wherein the EMI shield device comprises a plurality of apertures for interfacing with a standardized CRU frame.

6. The electronic device of claim 1, further comprising a network interface, a power source, and a bus.

* * * * *